United States Patent [19]

Glick

[11] 4,068,022

[45] Jan. 10, 1978

[54] METHODS OF STRENGTHENING BONDS

[75] Inventor: William F. Glick, Coplay, Pa.

[73] Assignee: Western Electric Company, Inc., New York, N.Y.

[21] Appl. No.: 531,430

[22] Filed: Dec. 10, 1974

[51] Int. Cl.² .............................................. B05D 5/12
[52] U.S. Cl. .................................... 427/125; 427/123; 427/124; 427/271; 427/383 A; 427/383 B; 357/71
[58] Field of Search ............... 427/123, 124, 125, 404, 427/383, 99, 271, 383 A, 383 B; 357/71

[56] References Cited

U.S. PATENT DOCUMENTS

| 3,290,127 | 12/1966 | Kahng et al. | 357/71 |
| 3,386,894 | 6/1968 | Steppat | 29/590 |
| 3,528,893 | 9/1970 | Christie et al. | 357/71 |
| 3,665,254 | 5/1972 | Collard et al. | 357/15 |
| 3,686,080 | 8/1972 | Banfield et al. | 357/71 |
| 3,708,403 | 1/1973 | Koger et al. | 357/71 |
| 3,765,970 | 10/1973 | Athanas et al. | 357/71 |
| 3,783,056 | 1/1974 | Keller et al. | 156/3 |
| 3,890,177 | 6/1975 | Pfahnl et al. | 156/13 |

Primary Examiner—Cameron K. Weiffenbach
Attorney, Agent, or Firm—R. Y. Peters

[57] ABSTRACT

The adherence of thin-film conductors to supporting substrates, and therefore the strength of external lead bonds made to the conductors, is increased by forming the conductors first and then heat treating them in air. The conductors may be formed from layers of titanium, palladium and gold sequentially deposited on the substrate or, in order to reduce the amount of gold, a portion of it may be replaced by copper and nickel.

8 Claims, 5 Drawing Figures

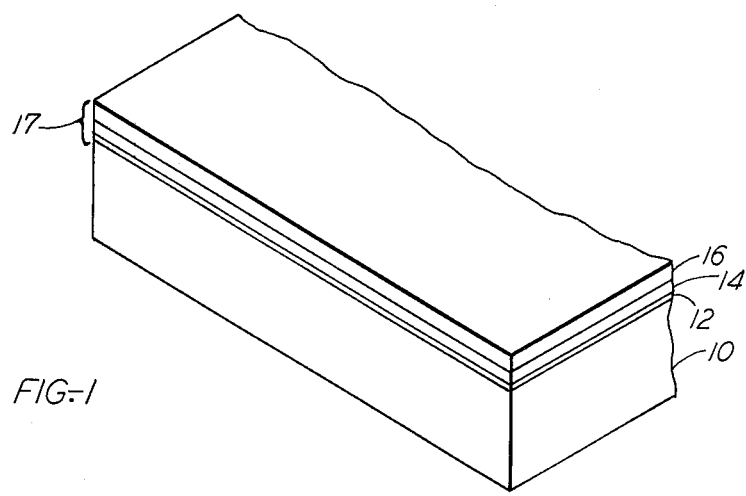
FIG.-1
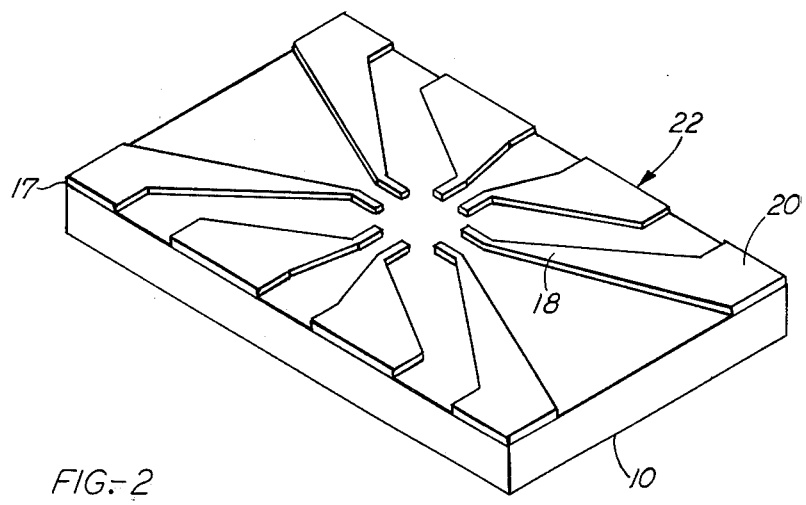
FIG.-2
FIG.-3
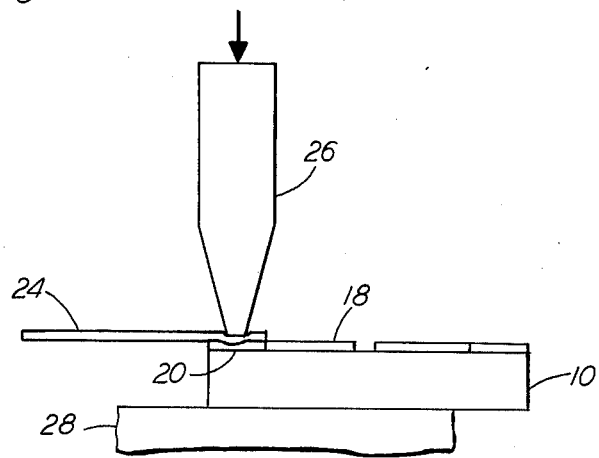

METHODS OF STRENGTHENING BONDS

BACKGROUND OF THE INVENTION

1. Field of the Invention

The invention relates to methods for strengthening bonds, and more particularly, to methods for strengthening bonds between thin-film conductors and insulating substrates on which they are formed and, thereby, connection of external leads made to the conductors.

2. Description of the Prior Art

Films are divided, in the electronic art, into two general classes: thick films and thin films. The thick films originate from a paste, of metallic particles and a vehicle, which is silk screened onto a substrate. Such films are usually fired (see Paul Sayers, "Molecular Bonding Conductive Films," *Solid State Technology*, September 1974, pp. 66–69) at 800° C and higher. Typically, the films are 250,000A (angstroms) (0.001 inches) or more thick but may be as little as 50,000A (0.0002 inches) thick after firing. Thin films, on the other hand, originate from direct vacuum deposition of metals on a substrate and may be 125,000A (0.0005 inches) thick but typically are less than 30,000A thick. This is in accord with Berry, Hall and Harris, *Thin Film Technology*, D. VanNostrand, Princeton, New Jersey (1968), pg. 2, where it is stated that "Thin films for electronic circuit applications range from a few hundred angstroms to tens of thousands of angstroms in thickness."

In order to make thin-film resistors, a film of tantalum or other resistive material is deposited on a substrate, usually by sputtering. A conductive material, which may be deposited either or both by evaporation and plating is also required in order to form contact pads and/or conductors that will permit electrical connections to be made to the resistors. The electrical connections are generally made by thermocompressively bonding external leads to the contact pads and/or conductors and it is desirable to improve the strength of these bonds.

In the past, it has been recognized that thin film resistors were stabilized by heat treatment (see U.S. Pat. No. 3,159,556 issued to D. A. McLean et al. on Dec. 1, 1964) but the workers in the thin film art did not recognize that a correlation existed between heat treatment and the strength of the external lead bonds subsequently made to the contact pads or conductors.

SUMMARY OF THE INVENTION

Accordingly, an object of the invention is to provide new and improved methods for strengthening the adherence between a thin-film conductor and an insulating substrate when no material for resistors is deposited thereon. It is another object to provide an improved method of strengthening an external lead bond made to a thin-film conductor formed on a substrate when no material for resistors is deposited thereon.

With this and other objects in view, the present invention contemplates a new method of strengthening the bond between a thin-film conductor and an insulating substrate wherein the substrate and conductors are heat treated after the conductors are formed.

Titanium-palladium-gold films are deposited sequentially on a ceramic substrate to provide a composite, conductive, thin film. Conductors and/or conductor pads are formed from the film. The substrate with the conductors thereon is heated at about 250° C for approximately five hours in air to increase the adherence of the conductors to the substrate. Finally, external leads are thermocompressively bonded to the conductors and/or contact pads.

BRIEF DESCRIPTION OF THE DRAWINGS

Other objects, advantages, and features of the invention will be apparent from the following detailed description thereof, when read in conjunction with the accompanying drawings, in which:

FIG. 1 is a partial isometric view of a ceramic substrate with a thin film of metal layers, exaggerated in thickness for clarity, deposited thereon;

FIG. 2 is an isometric view of the ceramic substrate of FIG. 1 with conductors and contact pads formed from the thin-film;

FIG. 3 is an end elevation of a thermode bonding an external lead to a conductor of FIG. 2;

DETAILED DESCRIPTION

Figure 4:
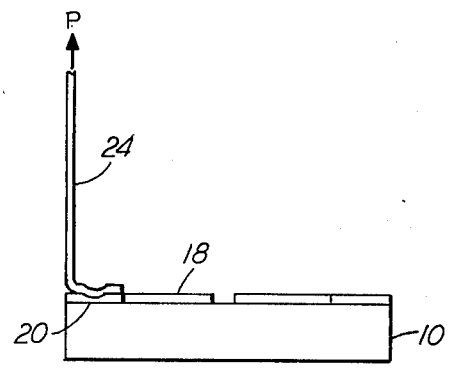
FIG. 4 is an end elevation of a lead being pulled at an angle of 90° to the substrate to determine its pull strength.

It has been found that the stability of resistors, formed from the resistive material, such as that derived from tantalum or chromium, deposited on the substrate, can be increased or improved by heat treatment. When the substrate is heated at temperatures from 200° to 400° C for 2 to 10 hours, much less change occurs in the resistance of the resistors during the course of a 670 hour life test at 150° C, than without the heat treatment. The heat treatment, tests and results are disclosed in the aforementioned U.S. Pat. No. 3,159,556.

It was observed in making some semiconductor devices containing tantalum resistors, which were heat treated to stabilize the resistors, that the strength of lead bonds made to these devices were generally stronger than those made to devices which did not contain resistors. This phenomenon was ultimately traced to the fact that the devices containing resistors were heat treated and the heat treatment increased the adherence of the conductor to the substrate. Thus, highly desirable, stronger lead bonds occur in those thin-film circuit devices which contain resistors because of the heat treatment they receive. The adherence and stronger bonds are just as desirable for thin-film circuits formed on substrates on which no tantalum or nichrome for resistors has been deposited. Such substrates receive no stabilizing heat treatment because no resistors are formed on them.

Referring now to FIG. 1, a substrate 10 may be a ceramic material such as that sold by the American Lava Company under the trade designation "A-76246" or the Coors Company under the trade designation "C-2170-42". A layer of titanium 12 is first deposited on the substrate 10, preferably by the well known art of evaporation, to a thickness of about 1700 to 2500A to increase the adherance of any layer deposited subsequently.

Next, a layer of palladium 14 is deposited on the titanium by evaporation; preferably to a thickness of about 3000A.

Finally, a layer of gold 16 is plated over the palladium 14 to a thickness of about 20,000A to provide a composite, conductive thin film 17 on the substrate 10.

If it is desired to reduce the amount of gold, copper may be substituted for most of the gold, i.e., the gold layer may be replaced by a layer of copper plated with gold.

The gold is needed to provide a good unoxidized bonding surface. However, copper readily diffuses through gold and oxidizes destroying the bonding surface. A barrier layer of nickel, therefore, is placed between the copper and gold. Accordingly, a conductor layer which includes copper would consist of titanium and palladium sequentially evaporated on the substrate and then copper, nickel and gold sequentially plated on the palladium.

Referring now to FIG. 2, the composite conductive metal layer of titanium 12, palladium 14 and gold 16, i.e., then film 17, is formed into a pattern 22 of individual conductors 18 and contact pads 20 on the substrate 10. The pattern 22 includes no resistors and, therefore, no layer of resistor material such as tantalum or nichrome is involved. The conductors 18 and pads 20 are formed by photoresist and etch techniques well known in the art. For example, see Berry, Hall and Harris, *Thin Film Technology*, D. VanNostrand Company, Inc., Princeton, N. J. (1968), Chapter 10; or Maissel and Glange, *Handbook of Thin Film Technology*, McGraw-Hill, Inc., New York (1970), Chapter 7.

Referring now to FIG. 3, an external lead 24 is thermocompressively bonded to the contact pad 20, or the conductor 18 itself if no contact pad is needed for formed, by heat of a thermode 26 and the pressure applied between it and an anvil 28 which supports the substrate 10. Preferably, the external lead 24 is copper plated with gold and is part of a lead frame containing enough leads for the entire pattern 22.

Thermocompression bonding is a solid-phase bonding technique which forms the bond between two members by inducing a suitable amount of material flow in one or both members. The material flow is induced by the application of heat and pressure, which are maintained for a suitable length of time so that adhesion takes place without the presence of a liquid phase. This produces a bond between the external lead 24 and contact pad 20 or conductor 18 which will not separate when the lead 24 is bent at 90° to the surface of the substrate 10 and pulled as shown in FIG. 4.

The contact pads 20 and conductors 18 have no appreciable strength in themselves because they are only about 25,000A thick, i.e., 0.0001 of an inch. The strength of the conductors 18 and pads 20 lies in the strength of the substrate and how tightly the conductors and pads adhere to it. Accordingly, the metal-to-metal bond of an external lead to a conductor or pad is far stronger than either the conductor, the pad or the adherence to the substrate. When the lead 24 is pulled to test the strength of the bond, as in FIG. 4, the lead 24 itself breaks or pulls a piece of the contact pad 20 or conductor 18 from the substrate 10. The magnitude of the force P required to break the bond and pull the lead 24 free depends mainly on the adherence of the contact pads 20, or the conductors 18 if the leads are bonded to the conductors.

It has been found that when the substrate 10, with the pattern 22 of pads and 20 and conductors 18 already formed from thin-film material having a layer of titanium 12 against the substrate, is heat treated in air at 200° C to 400° C for from 1 to 8 hours, the adherence of the pads or conductors to the substrate is substantially increased. A preferable treatment consists of heating the substrates 10 with the pattern 22 formed thereon in air at a temperature of 250° C for 5 hours. This treatment increases the bond strength to the extent that pull test failures change from 25% occuring in the bonds to the substrate and the remainder in the leads, to only 6.6% in the bonds and the remainder in the leads. For example, where the conductors 18 and/or contact pads 20 are formed from sequentially deposited layers of titanium 1700A thick, palladium 3000A thick and gold 20,000A thick, the following table indicates the increased bond strength, in terms of pull force P, because of the improved adherence of conductors 18 and contact pads 20 to the substrate:

| % of entire distribution | Force P (lbs.) which the % of distribution is equal to or greater than | |
| --- | --- | --- |
| | with no heat treatment | with heat treatment (250° C for 5 hrs. in air) |
| 99 | 2.7 | 3.7 |
| 95 | 3.5 | 5.0 |
| 90 | 4.0 | 5.7 |
| 80 | 4.9 | 6.0 |

Experiments made at other temperatures, e.g., 350° C indicate that the higher temperatures increase both high and low pull strengths (Force P) but do not increase low pull strength as much as the 250° C treatment. Since the improvement is most advantageous where the strength is low, the 250° C treatment is preferred.

Figure 5:
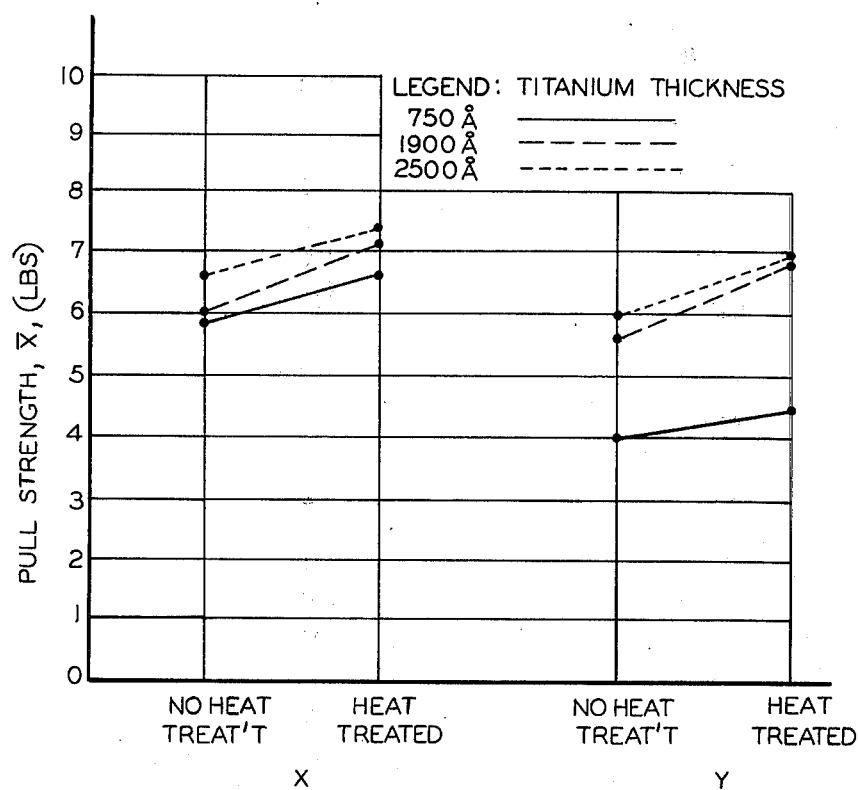
FIG. 5 is a graph showing the effect of heat treatment.

Additional results of heat treatment are shown in FIG. 5. The graph shows the average pull strength (Force P), X, for alumina ceramics of two different manufacturers X and Y, and for three different thicknesses of titanium. It is evident that, for both of the manufacturers and their materials, the heat treatment improves the pull strength, and that the highest pull strengths are obtained with the thickest titanium deposits.

It is theorized that, since the titanium is exposed to air after generation of the pattern 22 and since titanium is an excellent getter, additional oxide forms at the interface with the ceramic and this strengthens the bond. This hypothesis appears to be supported by the discovery that heat treatment of the substrate and metal layers before the pattern 22 is formed to expose the edges of the conductors 18 and/or pads 20, does not appear to produce stronger lead bonds.

While there has been described and illustrated herein practiced embodiments of the present invention, it is understood that various modifications and refinements, which epart from the disclosed embodiment, may be adopted without departing from the spirit and scope of the present invention. For example, heat treatment of the substrates 10 with the pattern 22 in oxygen, or a mixture of oxygen and an inert gas, or a mixture of oxygen and nitrogen in proportions other than that found in air, or substitution of platinum for palladium, might be adopted.

What is claimed is:

1. A method of strengthening the bond between a thin-film conductor and an alumina substrate on which the conductor is formed, which comprises the sequential steps of:

depositing at least two metal layers, the first of which is titanium and the second is palladium, on said substrate to form a thin film of conductive material thereon;

removing a portion of the conductive material to form at least one thin-film conductor from said material, said conductor having exposed edges; and heating the substrate and conductor for a predetermined period in an oxidizing atmosphere to improve the strength of the bond between the conductor and the substrate.

2. A method of improving bond strength between a thin film conductor and an alumina substrate on which the conductor is formed, comprising the sequential steps of:
   a. depositing successive layers of an adhesive metal of titanium and a conductive metal of palladium starting with the adhesive metal against the substrate;
   b. removing those portions of the adhesive and conductive metal layer not needed for the conductor to form and expose the edges of said conductor; and
   c. heating the substrate, and conductor so formed, in air for a predetermined length of time to improve the strength of the bond between the conductor and the substrate.

3. A method, as recited in claim 2, wherein the step of depositing the metal layers comprises:
   a. evaporating a first layer of titanium; and then
   b. depositing on said first layer at least a second layer of a metal selected from the group comprising palladium and platinum.

4. A method, as recited in claim 3, wherein the depositing step (b) comprises the further step of:
   depositing a third layer by plating a conductive metal on the second layer, said third layer being selected from the group comprising copper, nickel and gold.

5. A method, as recited in claim 4, wherein the step of heating comprises:
   heating the substrate and conductor in air at 250° C for 5 hours to inrease the adherence of the conductor to the substrate and, thereby the strength of bonds made thereto.

6. A method of strengthening the bond between a thin film conductor and an alumina substrate on which the conductor is formed comprising the sequential steps of:
   evaporating a layer of titanium on the alumina substrate;
   evaporating a layer of palladium on the titanium;
   plating a layer of copper on the palladium;
   plating a layer of nickel on the copper;
   plating a layer of gold on the nickel, the combined evaporated and plated layers forming a single thin-film coating of conductive material on the substrate;
   removing at least a portion of the material to form a thin-film conductor; and
   heating substrate and the conductor for a predetermined period of time in air to improve the strength of the bond between the conductor and the substrate.

7. A method as recited in claim 6, wherein the heating step is performed at a temperature between 200° and 400° C for 1 to 8 hours.

8. A method as recited in claim 7, wherein the titanium thickness is between 1700 and 2500A, the palladium is about 3000A, and the gold about 20,000A thick.

* * * * *

UNITED STATES PATENT OFFICE
CERTIFICATE OF CORRECTION

Patent No. 4,068,022                      Dated     January 10, 1978

Inventor(s) WILLIAM F. GLICK

It is certified that error appears in the above-identified patent and that said Letters Patent are hereby corrected as shown below:

Column 1, line 10, "2." should be deleted.
Column 3, line 14, "then" should be --thin--;
         line 27, "for" should be --or--;
         line 61, delete "and" first occurrence.
Column 4, line 51, "epart" should be --depart--.
Column 6, Claim 5, line 6, "inrease" should be --increase--.

Signed and Sealed this

Ninth Day of May 1978

[SEAL]

Attest:

RUTH C. MASON
*Attesting Officer*

LUTRELLE F. PARKER
*Acting Commissioner of Patents and Trademarks*